United States Patent
Lee

(10) Patent No.: US 6,727,461 B2
(45) Date of Patent: Apr. 27, 2004

(54) SILICON WAFER PROTECTION FILM TRIMMING METHOD AND TRIMMER

(75) Inventor: Masahiro Lee, Tokai (JP)

(73) Assignee: Teikoku Taping System Co., Ltd., Aichi (JP)

( * ) Notice: Subject to any disclaimer, the term of this patent is extended or adjusted under 35 U.S.C. 154(b) by 0 days.

(21) Appl. No.: 10/238,891

(22) Filed: Sep. 11, 2002

(65) Prior Publication Data

US 2003/0089692 A1 May 15, 2003

(30) Foreign Application Priority Data

Sep. 11, 2001 (JP) ........................................ 2001-275526

(51) Int. Cl.[7] ............................................... B23K 26/00
(52) U.S. Cl. ............................. 219/121.72; 219/121.85
(58) Field of Search ........................ 219/121.72, 121.67, 219/121.85

(56) References Cited

U.S. PATENT DOCUMENTS 5,808,272 A * 9/1998 Sun et al. ............... 219/121.68
5,968,612 A * 10/1999 Takayama et al. .......... 427/579

FOREIGN PATENT DOCUMENTS

JP 10-032179 2/1998

* cited by examiner

Primary Examiner—M. Alexandra Elve
(74) Attorney, Agent, or Firm—Morgan Lewis & Bockius LLP

(57) ABSTRACT

A trimming method and a trimmer capable of ensuring trimming a protection film which protects a silicon wafer and making a cut end of the protection film obtained by trimming neat, are provided. If a laser beam L is applied to the strip protection film 3 bonded onto the silicon wafer 1 to trim the protection film to have a predetermined size and a predetermined shape, an intake flow V such as an air curtain flow is applied to the protection film 3. A trimmer used to execute this method consists of a table 2 on which the silicon wafer 1 is mounted, an assigning and separation unit D for bonding the strip protection film 3 onto the silicon wafer 1, a laser beam unit G provided above the table for forming a cut 28 into the protection film 3 along a peripheral surface 1a of the silicon wafer 1, and an intake unit Av provided below the table for applying an intake flow V to a lower surface of the protection film 3 along the peripheral surface 1a.

8 Claims, 7 Drawing Sheets

SILICON WAFER PROTECTION FILM TRIMMING METHOD AND TRIMMER

BACKGROUND OF THE INVENTION

1. Field of the Invention

The present invention relates to a trimming method and a trimmer for bonding a strip protection film to one of the front and rear surfaces of a silicon wafer and then cutting this protection film to have a shape along the outer shape of the silicon wafer.

2. Description of the Prior Art

There are known hitherto, in a method for manufacturing a semiconductor device for an IC, LSI or an ultra LSI, the step of boding a protection film to the surface of a silicon wafer and protecting the silicon wafer, and the step of cutting and polishing the rear surface of the silicon wafer obtained in the former step and making a finally obtained semiconductor device to have a predetermined thickness. In the former step, as described in Japanese Patent Unexamined Application Publication No. 10-32179, a strip protection film is temporarily bonded onto a silicon wafer and then a part of the protection film which excessively extends outward of the outer periphery of the silicon wafer is cut off, i.e., so-called trimming is conducted.

However, following the recent higher integration of electronic equipment, demand for making semiconductor devices used in the equipment small in size and light in weight becomes greater and the thickness of the protection film is necessary to be decreased. For example, it is demanded that the thickness of a protection film which is conventionally, normally about 100 $\mu$m be decreased to about 15 $\mu$m. As a result, if the thinner protection film is trimmed even by a laser beam, the film cannot smoothly cut off. Even if the protection film can be cut off, the cut end face of the film cannot be made neat. Thus, a problem that the quality of a semiconductor device itself or the later steps of the manufacturing process of the semiconductor device are adversely influenced and the like appear.

SUMMARY OF THE INVENTION

The inventor of the present invention investigated causes for the problems and found the following facts. If the thickness of the protection film decreases to a certain degree, then it becomes difficult to cut off the protection film itself, the cut end of the film is contracted by heat generated by a laser beam and the cut end face of the trimmed protection film cannot be made neat. Taking them into consideration, the inventor of the present invention could eventually complete the present invention.

Therefore, it is an object of the present invention to provide a silicon wafer protection film trimming method capable of ensuring trimming a protection film which protects a silicon wafer and making the cut end face of the trimmed protection film neat, and to provide a trimmer optimum for realizing this trimming method.

The invention will now be described following.

The trimming method according to the present invention exhibits excellent advantages in that it is possible to ensure trimming a protection film which protects a silicon wafer and the cut end face of the protection film thus trimmed can be made neat.

The trimmer according to the present invention exhibits excellent advantages in that it is possible to ensure trimming a protection film which protects a silicon wafer and the cut end face of the protection film thus trimmed can be made neat.

DETAILED DESCRIPTION OF THE INVENTION

Figure 1:
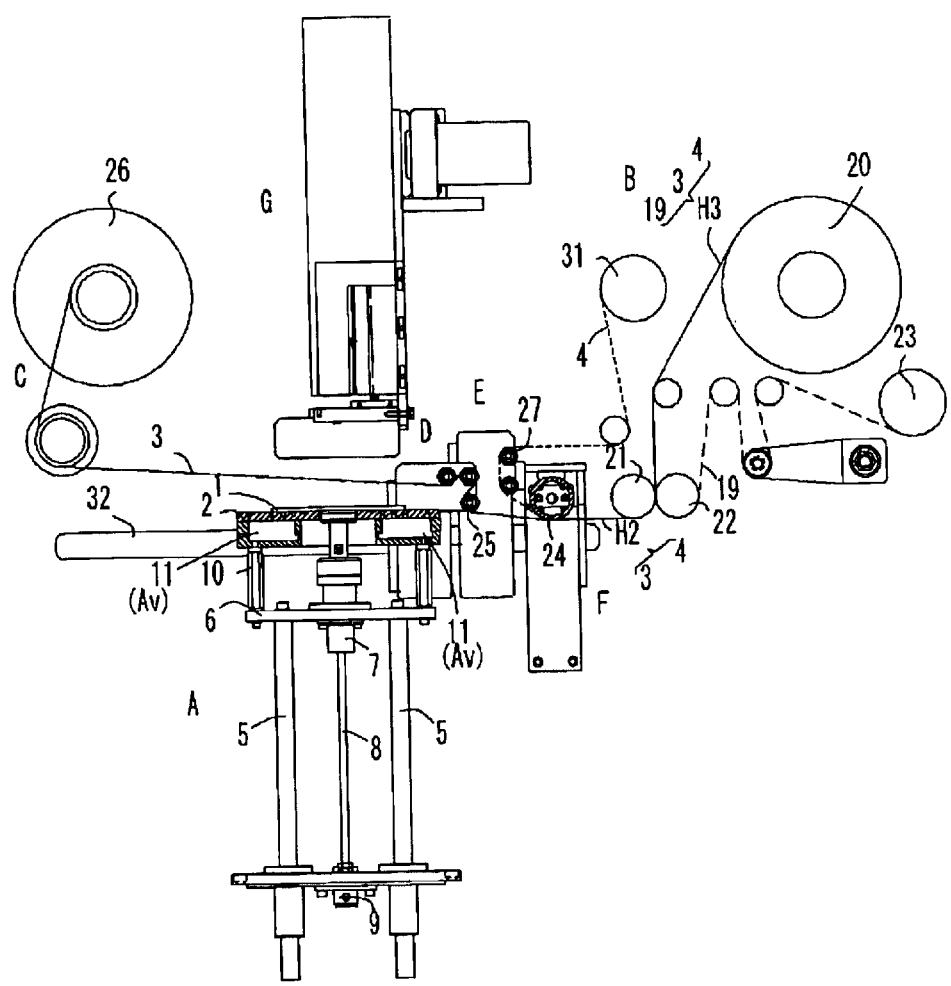
FIG. 1 is a side view of a trimmer.

The invention will now be described in detail.

A silicon wafer protection film trimming method according to the present invention is characterized in that when a laser beam is applied to a protection film bonded onto a silicon wafer to trim the protection film, an intake flow is applied to a rear surface of a surface of the protection film to which the laser beam is applied.

According to the trimming method of the present invention, the protection film can be sucked and cooled by the intake flow and trimmed by the laser beam while being sucked and cooled. Therefore, it is possible to accelerate and facilitate cutting the protection film by the suction function of the intake flow. In addition, it is possible to suppress the deformation of the cut end of the protection film by the cooling function of the intake flow to thereby provide a neat cut end face.

Further, the intake flow can be an air curtain flow oriented in a traveling direction of the laser beam. If so, it is possible to further facilitate cutting the protection film by the laser beam and to make the cut end face neater.

A silicon wafer protection film trimmer according to the present invention is characterized by comprising: a table on which a silicon wafer is mounted; bonding means for bonding a protection film onto the silicon wafer; laser beam means, provided above the table, for forming a cut into the protection film along a peripheral surface of the silicon wafer; and intake means, provided below the table, for applying an intake flow to a lower surface of the protection film along the peripheral surface of the silicon wafer.

According to the trimmer of the present invention, the protection film is bonded onto the silicon wafer which is mounted on the table. When trimming this protection film by a laser beam, the protection film can be sucked and cooled by the intake flow. Therefore, it is possible to accelerate and facilitate cutting the protection film by the suction function of the intake flow. In addition, it is possible to suppress the deformation of the cut end of the protection film by the cooling function of the intake flow to thereby provide a neat cut end face.

Further, the table has an annular slit opened to an upper surface side of the table, and having a radius corresponding to a radius of the silicon wafer, the annular slit serving as an intake port of the intake means. If so, it is possible to provide a simple, small-sized trimmer which can further facilitate cutting a protection film by a laser beam and make the cut end face of the protection film neater.

Furthermore, a radial opening width of the annular slit can be made smaller upward. If so, it is possible to accelerate the flow velocity of the intake flow introduced into the annular slit and to thereby improve the effect of sucking and cooling the protection film.

Moreover, the opening width can be made smaller by steps upward. If so, it is possible to further accelerate the flow velocity of the intake flow and to thereby further improve the effect of sucking and cooling the protection film.

Further, a plurality of the annular slits can be provided concentrically. If so, it is possible to trim the protection film to correspond to each of a plurality of silicon wafers having various sizes and different radii.

In addition, the intake means can comprise a plurality of uniform pressure chambers provided below the table, and the uniform pressure chambers can communicate with the annular slit. If so, it is possible to suck the air of almost equal quantity or equal velocity from the annular slit.

The "protection film" can be, for example, thermo-sensitive adhesive and/or photosensitive. Further, the protection film can be exemplified by a resin film, a polyimide film or the like. If the protection film is thin (e.g., about 15 $\mu$m), the film does not exhibit stable tensile strength. In this case, therefore, the protection film can be laminated with the other film, i.e., a reinforcement film and the resultant laminate film can be bonded onto the silicon wafer. After peeling off this reinforcement film, the trimming of the protection film by the laser beam can be executed. Besides, to smoothly handle the protection film during manufacturing process and transport process, a film called carrier film is normally laminated on the rear surface of the protection film.

DESCRIPTION OF THE PREFERRED EMBODIMENT

The present invention will be descried more concretely with reference to the drawings.

As shown in FIG. 1, a trimmer according to the present invention mainly consists of a table means A which supports a table 2, on which a silicon wafer 1 is mounted, from below, a pair of film supply means B and a winding means C which are disposed diagonally upward of the table means A at predetermined intervals so as to almost horizontally cross a strip protection film 3 slightly upward of the table 2, an assigning and separation means D (which is shown as a bonding means herein) which assigns the protection film 3 to the silicon wafer 1 and peels off the protection film 3 which is bonded to the silicon wafer 1 by a joint means to be described later after temporarily assigning the protection film 3 to the silicon wafer 1, a peel-off means E which peels off a reinforcement film 4 which is laminated on the protection film 3 from the protection film 3, the joint means F which joins the protection film 3 and the reinforcement film 4 to the silicon wafer 1, and a laser beam means G which forms a predetermined cut into the protection film 3 joined to the silicon wafer 1 and trims the protection film 3.

The table means A consists of a plurality of vertically movable slide rods 5, a substrate 6 which is attached to the tip end portions of the slid rods 5, a support section 7 which is provided in the central portion of the substrate 6, an intake pipe 8 which is vertically attached to the support section 7, a pipe joint 9 which is provided integrally with the proximal end portion of the intake pipe 8, and a plurality of uniform pressure chambers 11 which are provided on the peripheral edge of the substrate 6 through the support section 10. The tip end face of the intake pipe 8 penetrates the central portion of the table 2 to air-chuck the silicon wafer 1. Accordingly, in the table means A, if the slid rods 5 are expanded by an expansion means such as an air cylinder provided on a frame, not shown, the table 2 is made vertically movable. If the internal pressure of the intake pipe 8 is reduced by a pressure reducing device, such as a vacuum tank or an intake pump, not shown, the silicon wafer 1 is vacuum-chucked onto the table 2.

Figure 2:
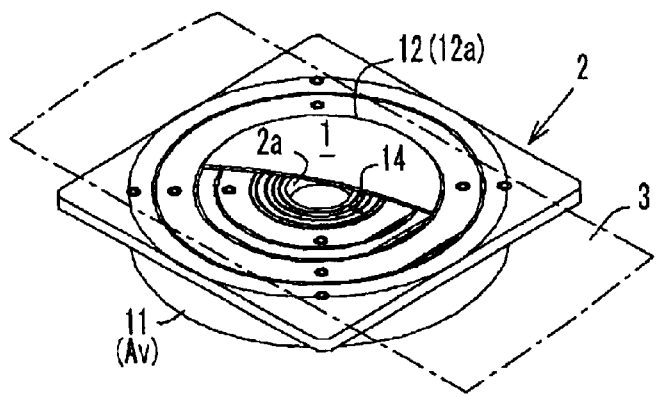
FIG. 2 is a broken-out perspective view of a table which is disposed on the trimmer.
Figure 3:
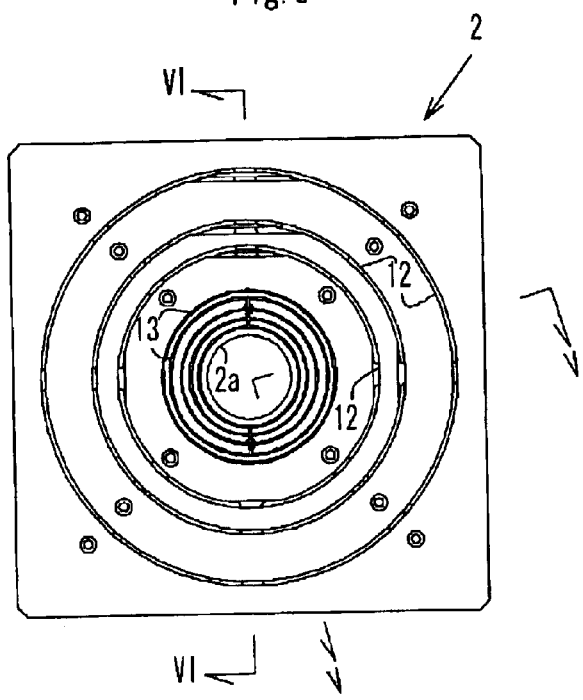
FIG. 3 is a top view of the table.
Figure 4:
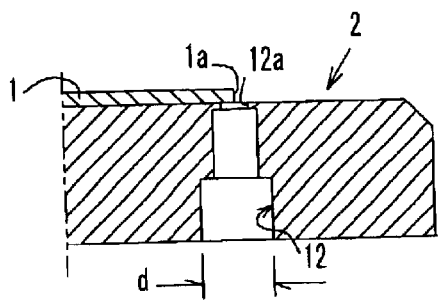
FIG. 4 is a partial longitudinal sectional view of the table.

As shown in FIGS. 2 and 3, the table 2 is a plate member which has square upper and lower surfaces and has a transparent hole section 2a provided in a central portion for causing the tip end portion of the intake pipe 8 to penetrate the central portion thereof. A plurality of annular slits 12 having different radii are concentrically formed on the upper surface of the table 2. If the silicon wafers 1 having various radii are mounted on the table 2, the outer peripheral surface 1a of each silicon wafer 1 faces the opening 12a of one of the annular slits 12 as shown in FIG. 4.

Figure 5:
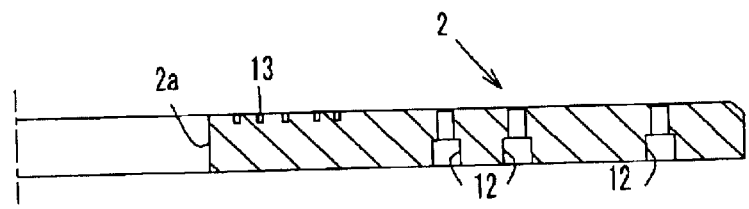
FIG. 5 is a cross-sectional view taken along line V—V of FIG. 3.
Figure 6:
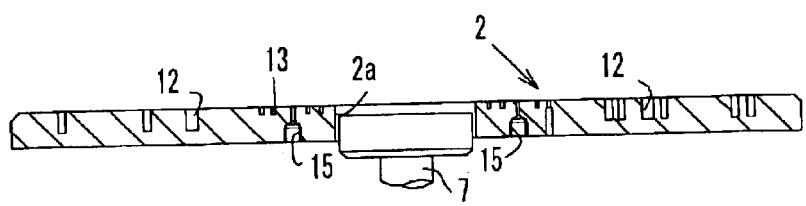
FIG. 6 is a cross-sectional view taken along line VI—VI of FIG. 3.

As shown in FIGS. 2, 3 and 5, a plurality of annular grooves 13 are concentrically arranged near the transparent hole section 2a on the upper surface of the table 2. As shown in FIG. 6, a plurality of injection holes 15 communicate with a part of these annular grooves 13 from below. Further, the respective injection holes 15 are connected to a compressed air source (not shown) which supplies compressed air. Further, just before the protection film 3 is cut off by a laser beam, to be described later, the air is injected from the annular grooves 13 through the injection holes 15 to cool the silicon wafer 1 so as to facilitate peeling off the reinforcement film 4 from a laminate film H2.

Figure 7:
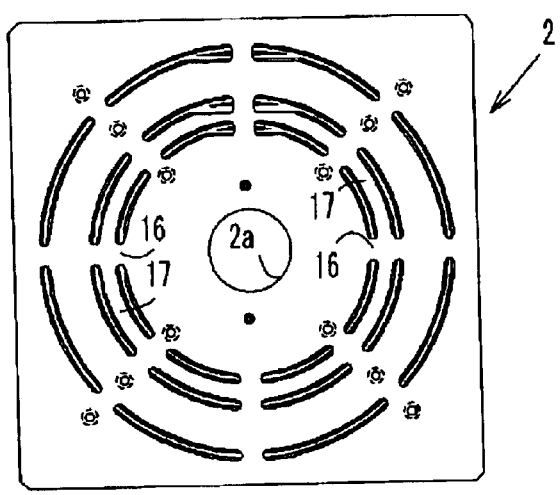
FIG. 7 is a bottom view of the table.
Figure 8:
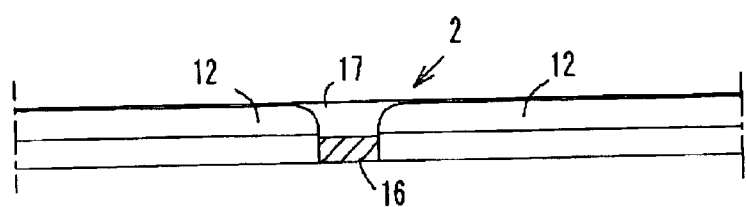
FIG. 8 is a side sectional view of the table which shows that a part of an annular slit is developed.

As shown in FIGS. 7 and 8, bridging section 16 which bridge the lower portions of the annular slits 12 are formed in portions of the annular slits 12 near the lower surface of the table 2 at predetermined intervals, to hold the boundary sections 17 between the plurality of annular slits 12 which differ in radius of curvature. The radial opening widths of the annular slits 12 are made smaller in upper portions. Preferably, as shown in FIG. 4, the opening width d is made smaller upward by steps.

As shown in FIGS. 1, 2 and 7, a plurality of, preferably four uniform pressure chambers 11 are provided on the lower surface of the table 2 and flexible intake pipes (not shown) are extended from the bottoms (or sidewalls) of the chambers 11 toward the pressure reducing device. Since the upper end face of each uniform pressure chamber 11 is closed by the table 2 to be substantially made airtight, the internal pressure of each uniform pressure chamber 1 is spread to the annular slits 12 formed in the table 2. Due to this, if the pressure reducing device is driven, the pressure of the intake pipes, the uniform pressure chambers 11 and the annular slits is reduced. As a result, the air in an atmosphere of the upper portion of the openings 12a of the annular slits 12 is sucked from the openings 12a. In this context, a plurality of elements such as the pressure reducing device, the intake pipes and the uniform pressure chambers 11, which constitute the table means will be referred to as "intake means Av" according to the present invention.

The film supply means B will be described next. As shown in FIG. 1, the film supply means B consists of a supply drum 20 around which a laminate film H3 consisting of three layers of a reinforcement film 4 of polyethylene, polypropylene or the like, a protection film 3 and a carrier film 19 of polyethylene terephthalate is wound, a pair of pinch rollers 21 and 22 for drawing the laminate film H3 from the supply drum 20, a take-up drum 23 which takes up only the carrier film 19 which is separated from the laminate film H3 which passes through the pinch rollers 21 and 22, and other rollers.

Figure 9:
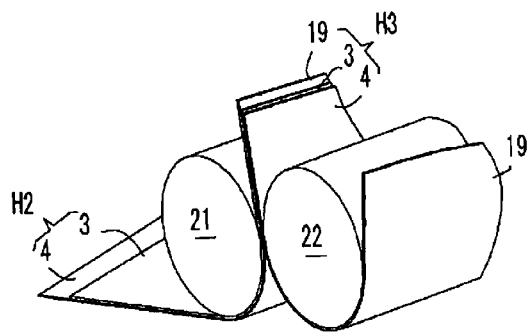
FIG. 9 is a perspective view of pinch rollers of the trimmer.

The remaining laminate film H2 from which the carrier film 19 is separated after passing through the pinch roller 21 and 22 is directly fed to the joint means F (also see FIG. 9). After slightly winding the laminate film H2 around the joint roller 24, the laminate film H2 is separated into the protection film 3 and the reinforcement film 4.

The protection film 3 which is separated from the laminate film H2 is wound around the winding roller 25 of the assigning and separation means D in a zigzag fashion, and then taken up by the take-up drum 26 of the take-up means C. Likewise, the reinforcement film 4 which is separated from the laminate film H3 is taken up by a take-up roller 31 through the winding roller 27 of the peel-off means E.

Figure 10:
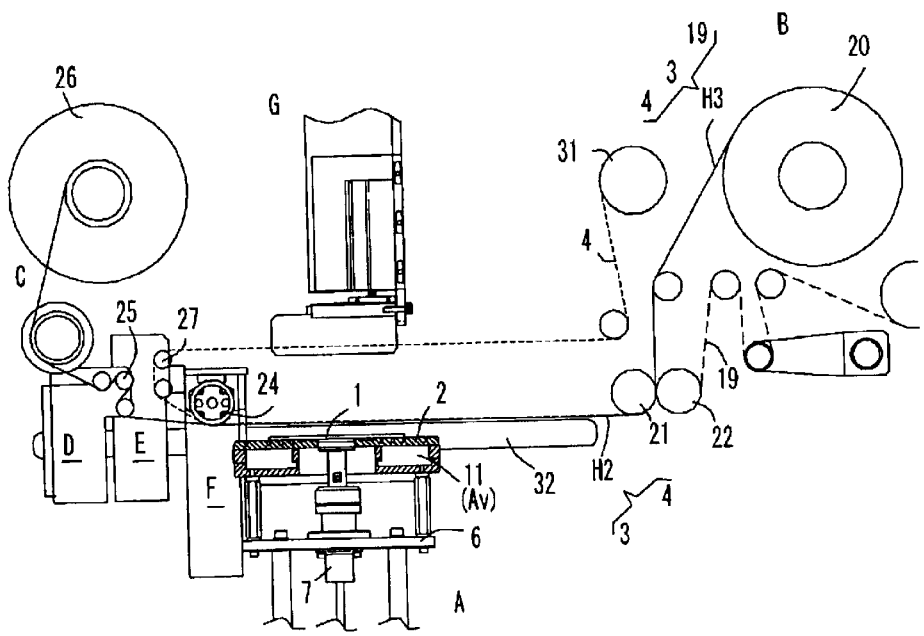
FIG. 10 is a side view showing one manner of driving the trimmer.

The joint means F, the assigning and separation means D and the peel-off means E are disposed to be displaceable from one side to the other side of the table means A while being guided by a sliding shaft 32 which extends in the traveling direction of the protection film 3. As shown in FIG. 10, if the protection film 3 is assigned to the silicon wafer 1 on the table 2, the assigning and separation means D, the peel-off means E and the joint means F move toward the take-up means C altogether while being kept to be proximate to one another. If so, the joint roller 24 of the joint means F simultaneously presses the protection film 3 assigned onto the silicon wafer 1 and the reinforcement film 4 which is kept separate from the protection film 3 toward the silicon wafer 1 side during the movement.

Figure 11:
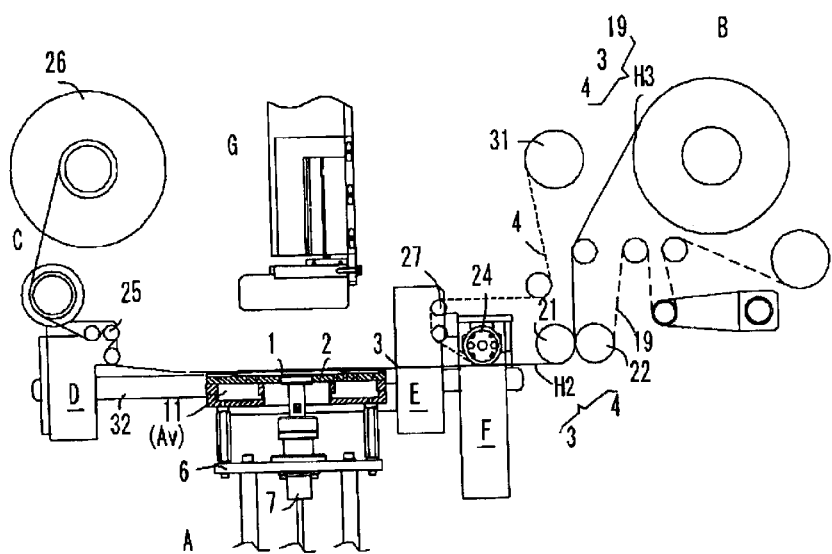
FIG. 11 is a side view showing another manner of driving the trimmer.

As shown in FIG. 11, if the joint means F and the peel-off means E are retreated to their original positions, the reinforcement film 4 is peeled off from the laminate film H2 on the silicon wafer 1 and the protection film 3 is joined to the surface of the silicon wafer 1. As the protection film 3, a pressure sensitive adhesive film or a thermo-sensitive adhesive film is employed. If the thermo-sensitive adhesive film is employed as the protection film 3, the protection film 3 can be joined to the silicon wafer 1 by preheating the silicon wafer 1.

Figure 12:
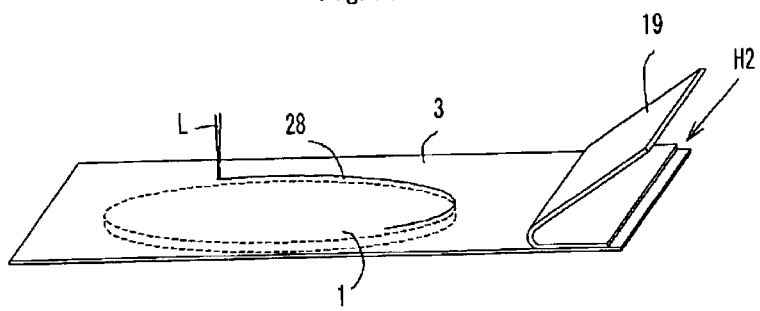
FIG. 12 is a perspective view showing a state in which a cut is formed into a protection film.

The trimmer of the present invention also includes the laser beam means G above the silicon wafer 1. As shown in FIG. 1, if the strip protection film G is joined to the surface of the silicon wafer 1, the laser beam means G is driven to form a cut 28 into the protection film 3 as shown in FIG. 12. At this moment, the laser beam means G is controlled by a computer to move horizontally along the outer peripheral surface of the silicon wafer 1.

Figure 13:
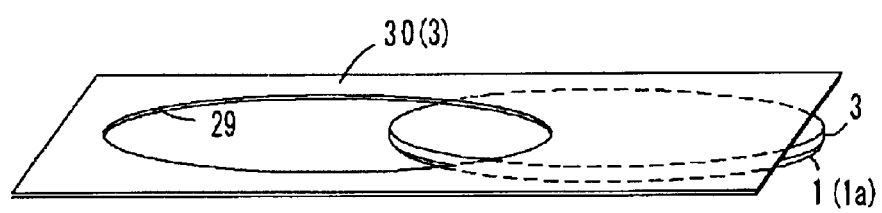
FIG. 13 is a perspective view showing a state in which the protection film has been trimmed.

If the annular cut 28 is formed into the protection film 3, the strip protection film 3 is changed to a residual film 30 which has a cut section 29 which is slightly larger than the outer shape of the silicon wafer 1 as shown in FIG. 13. Therefore, if the take-up means C is actuated, the residual film 30 can be taken up. Needless to say, the step also proceeds to the next step of joining the protection film 3 to the silicon wafer 1.

Figure 14:
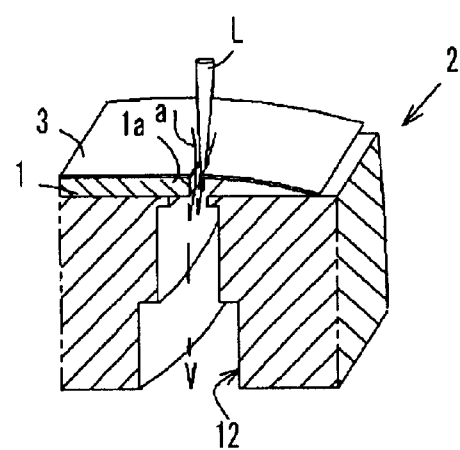
FIG. 14 is an enlarged cross-sectional view of important parts showing a state in which an intake flow strikes on the protection film which is being trimmed.

A trimming method according to the present invention will be described next. As shown in FIG. 11, the trimming method of the present invention starts when the protection film 3 is joined to the silicon wafer 1 on the table 2 of the table means A. First, when the pressure reducing device is driven, the uniform pressure chambers 11 communicating with the intake pipe are turned into a reduced pressure state. If the uniform pressure chambers 11 are in the reduced pressure state, the annular slits 12 of the table 2 provided on the uniform pressure chambers 11 are turned into a reduced pressure state. As indicated by an arrow a shown in FIG. 14, external air near the outer peripheral section of the silicon wafer 1 mounted on the table 2 is sucked into the lower surface side of the table 2, i.e., the uniform pressure chambers 11. As a result, a quick air curtain-like intake flow V is generated in each annular slit 12.

Since the surface of the silicon wafer 1 is already covered with the protection film 3, the protection film 3 contacts with the intake flow V and is cooled. In this state, if the laser beam means G is driven, a laser beam L is applied to the protection film 3 to form the cut 28 and the beam gun (not shown) of the laser beam means G is moved along the peripheral surface 1a of the silicon wafer 1 as described above, then trimming according to the present invention starts (see FIG. 12).

Further, since the intake flow V air-cools the protection film 3 during the trimming, the deformation of the protection film 3 is minimized as much as possible. As a result, a neat cut end face along the peripheral surface of the silicon wafer 1 is obtained. In addition, if the laser beam moves while cutting the protection film 3, the protection film 3 is sucked by the intake flow V (air curtain flow). This can accelerate cutting the cut end neatly by the laser beam L.

The present invention is not limited to the concrete embodiment described about but applicable to other embodiments modified variously within the scope of the present invention depending on purposes. That is, the present invention is also applicable to an embodiment in which the protection film is temporarily bonded to the rear surface of the silicon wafer 1.

What is claimed is:

1. A silicon wafer protection film trimming method, wherein when a laser beam is applied to a protection film bonded onto a silicon wafer to trim the protection film, an intake flow is applied to a rear surface of a surface of said protection film to which said laser beam is applied.

2. A silicon wafer protection film trimming method according to claim 1, wherein said intake flow is an air curtain flow oriented in a traveling direction of said laser beam.

3. A silicon wafer protection film trimmer comprising:

a table on which a silicon wafer is mounted;

bonding means for bonding a protection film onto said silicon wafer;

laser beam means, provided above said table, for forming a cut into said protection film along a peripheral surface of said silicon wafer; and intake means, provided below said table, for applying an intake flow to a lower surface of said protection film along the peripheral surface of said silicon wafer.

4. A silicon wafer protection film trimmer according to claim 3, wherein said table has an annular slit opened to an upper surface side of said table, and having a radius corresponding to a radius of said silicon wafer, said annular slit serving as an intake port of said intake means.

5. A silicon wafer protection film trimmer according to claim 4, wherein a radial opening width (d) of said annular slit is made smaller upward.

6. A silicon wafer protection film trimmer according to claim 5, wherein said opening width (d) is made smaller upward by steps.

7. A silicon wafer protection film trimmer according to claim 4, wherein a plurality of said annular slits are provided concentrically.

8. A silicon wafer protection film trimmer according to claim 4, wherein said intake means comprises a plurality of uniform pressure chambers provided below said table, said uniform pressure chambers communicating with said annular slit.

* * * * *